(12) United States Patent
Harder et al.

(10) Patent No.: US 8,866,008 B2
(45) Date of Patent: Oct. 21, 2014

(54) TRANSPARENT GLASS PANE PROVIDED WITH A SURFACE STRUCTURE

(71) Applicant: Saint-Gobain Glass France, Courbevoie (FR)

(72) Inventors: Nils-Peter Harder, Hameln (DE); Ulf Blieske, Edingen Neckarhausen (DE); Dirk Neumann, Herzogenrath (DE); Marcus Neander, Eschweiler (DE); Michele Schiavoni, Paris (FR); Patrick Gayout, Villemomble (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 13/842,135

(22) Filed: Mar. 15, 2013

(65) Prior Publication Data

US 2013/0269769 A1    Oct. 17, 2013

Related U.S. Application Data

(62) Division of application No. 11/917,474, filed as application No. PCT/FR2006/050551 on Jun. 13, 2006.

(30) Foreign Application Priority Data

Jun. 16, 2005   (DE) .......................... 10 2005 027 799

(51) Int. Cl.
| | |
|---|---|
| H01L 31/0203 | (2014.01) |
| H01L 31/0236 | (2006.01) |
| C03B 13/08 | (2006.01) |
| F24J 2/50 | (2006.01) |
| F24J 2/46 | (2006.01) |
| F24J 2/06 | (2006.01) |
| C03B 11/08 | (2006.01) |

(52) U.S. Cl.
CPC ............. *H01L 31/0236* (2013.01); *Y02E 10/40* (2013.01); *Y02E 10/52* (2013.01); *C03B 13/08* (2013.01); *Y02B 10/20* (2013.01); *F24J 2/505* (2013.01); *F24J 2/4607* (2013.01); *F24J 2/062* (2013.01); *C03B 11/082* (2013.01)
USPC ............ 136/259; 136/246; 136/256; 136/244

(58) Field of Classification Search
USPC .......... 136/246, 251, 259; 385/146, 129–132, 385/147
See application file for complete search history.

(56) References Cited

U.S. PATENT DOCUMENTS

| | | | |
|---|---|---|---|
| 3,068,754 | A | 12/1962 | Benjamin |
| 4,379,202 | A | 4/1983 | Chalmers |

(Continued)

FOREIGN PATENT DOCUMENTS

| | | |
|---|---|---|
| DE | 24 59 327 | 6/1976 |
| EP | 1 486 802 | 12/2004 |

(Continued)

OTHER PUBLICATIONS

U.S. Appl. No. 14/015,421, filed Aug. 30, 2013, Gayout, et al.

*Primary Examiner* — Jayne Mershon
(74) *Attorney, Agent, or Firm* — Oblon, Spivak, McClelland, Maier & Neustadt, L.L.P.

(57) ABSTRACT

A method of manufacturing a transparent pane, in particular a glass pane, which includes on at least one of its main surfaces a surface structure including an assembly of specified individual motifs in relief, in particular pyramids, cones, or truncated cones, created by embossing or by rolling. A structure is created on the surface of the pane constituted by individual motifs, based on one or more basic motifs but which are distinguished from each other by their depth, their height, and/or the perimeter of their base area, and/or by the position of their peak with respect to their base. With this variation, formation of intensity peaks of the reflected light is prevented and at the same time a high quality of light trapping is obtained by panes suitable, for example, for solar applications.

16 Claims, 6 Drawing Sheets

(56) References Cited

U.S. PATENT DOCUMENTS

| | | |
|---|---|---|
| 5,080,725 A | 1/1992 | Green et al. |
| 5,224,978 A | 7/1993 | Hermant et al. |
| 5,733,382 A * | 3/1998 | Hanoka .................. 136/251 |
| 5,771,328 A * | 6/1998 | Wortman et al. .......... 385/146 |
| 6,127,623 A * | 10/2000 | Nakamura et al. ......... 136/256 |
| 6,323,415 B1 * | 11/2001 | Uematsu et al. ........... 136/246 |
| 2001/0022721 A1 * | 9/2001 | Konomi .................... 362/29 |
| 2005/0039788 A1 * | 2/2005 | Blieske et al. ............. 136/246 |
| 2006/0054212 A1 | 3/2006 | Fraas et al. |

FOREIGN PATENT DOCUMENTS

| | | |
|---|---|---|
| EP | 1 548 470 | 6/2005 |
| FR | WO 03/046617 | 5/2003 |
| WO | 02/23258 | 3/2002 |
| WO | 02/064518 | 8/2002 |

* cited by examiner

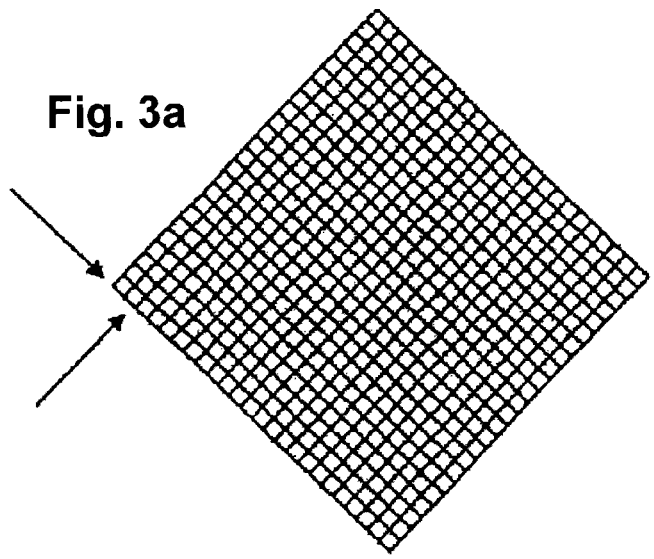
Fig. 3a
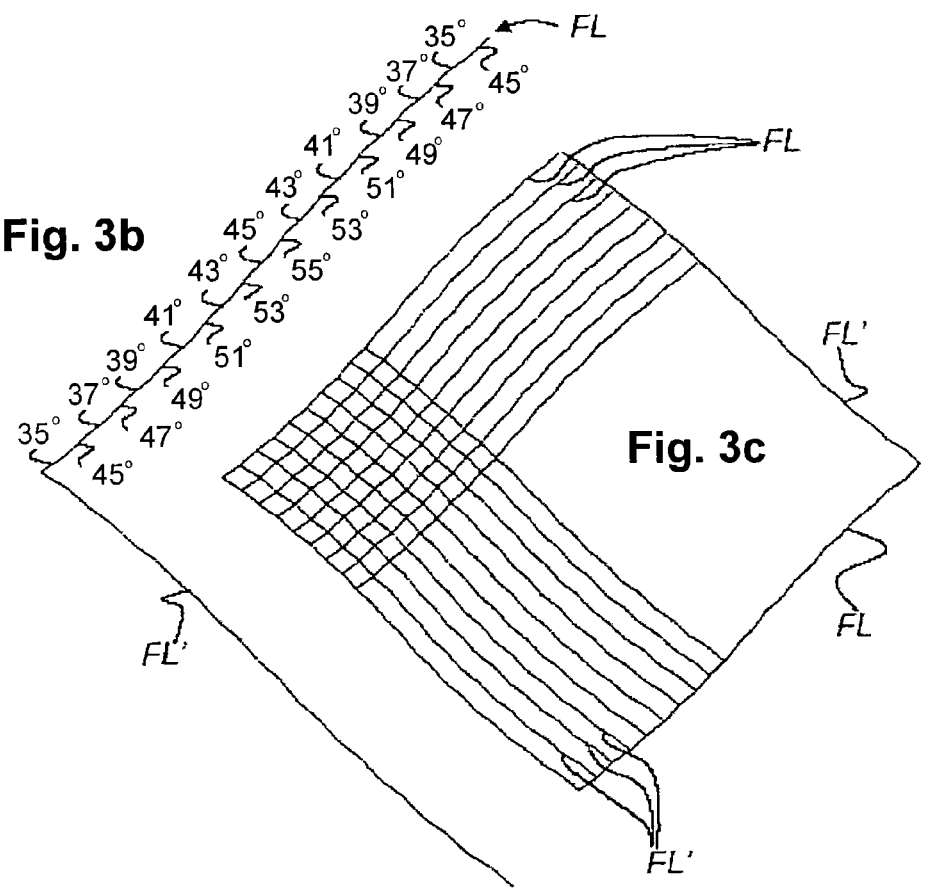
Fig. 3b
Fig. 3c

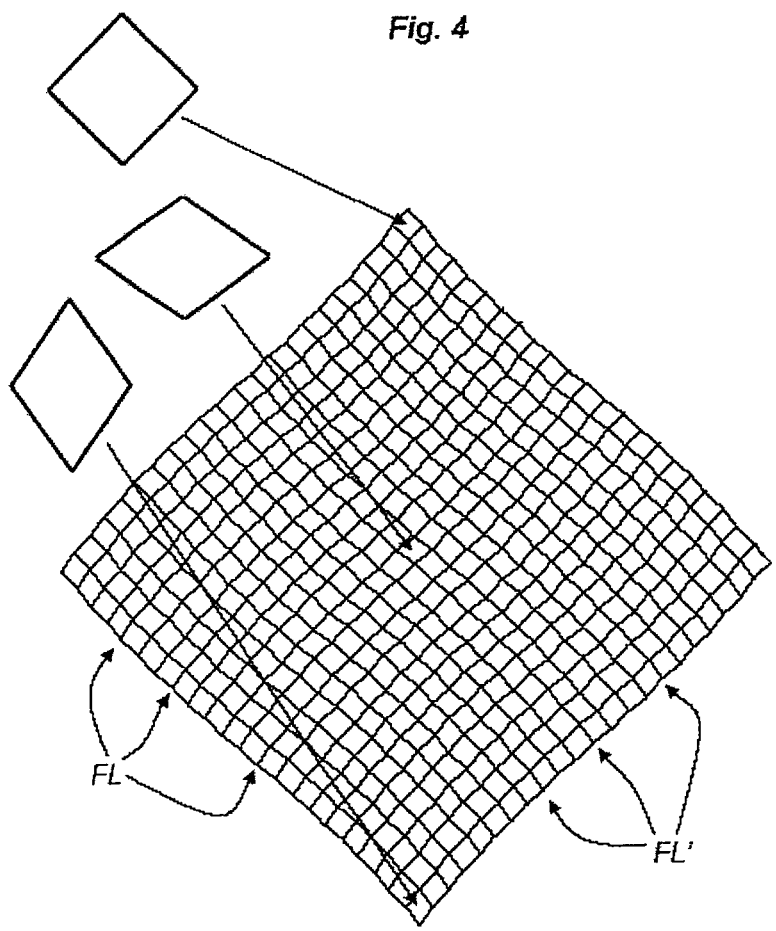

TRANSPARENT GLASS PANE PROVIDED WITH A SURFACE STRUCTURE

CROSS REFERENCE TO RELATED APPLICATIONS

This application is a divisional of U.S. application Ser. No. 11/917,474, filed Oct. 20, 2008, which is incorporated herein by reference in its entirety. U.S. application Ser. No. 11/917, 474 is a U.S. National Stage Application under 35 U.S.C. §371 of International Application No. PCT/FR2006/050551 filed Jun. 13, 2006, which claims priority to German Application No. 10 2005 027 799.3 filed Jun. 16, 2005.

TECHNICAL FIELD

The Invention relates to a pane, a method of manufacturing a transparent pane and a device for manufacturing a transparent pane and in particular a glass pane which is provided with a surface structure for capturing light.

The invention also relates to panes which have such surface structures, a device or a tool which is suitable to the implementation of the method as well as preferred uses of the panes.

BACKGROUND

From EP0493202B1 are known transparent panes provided with regular surface structures in which a structure impressed in the substrate is formed of pyramid-shaped recesses that are identical to each other and which are separated from each other by distances smaller than the biggest dimension of the recesses. The pyramids or truncated pyramids which are provided in them as a motif can be produced with a hexagonal or square base area but all have approximately plane side surfaces.

Combinations of embossing and of pyramids which protrude from their bottom have also been described. In particular, good light diffusion properties and a reduced visual detection of the presence of individual motifs which form the structure is obtained in this way due to a harmonious overall matt surface appearance.

Moreover, there is known, from WO03/046617A1, the manufacture and use of transparent plates (panes) provided with surface structures in the form of geometric relief which should improve the transmission of light and the light efficiency in particular for panes which are combined with solar cells (that is to say photoelectric cells or photovoltaic cells) and photovoltaic solar modules in solar collectors, flat plasma discharge lamps, image projection screens and projectors. The motifs of the geometric structure can in particular be concave with respect to the overall surface of the structured side of the pane, that is to say hot rolled into the initial substrate or formed in another appropriate way. In general, the motifs have a periodic shape, unlike that which is obtained by sandblasting or by etching methods. For technical production reasons (traversing speed, adhesion of rolled material on the rolls, etc.) it is not however possible to reproduce this periodicity with the desired accuracy. Moreover, undesirable periodic disturbances of the embossing operation can be added to it, for example due to dimensional deviations of the centering of the axes of the rolls when the rolling manufacturing method is used.

Because of this, on these structured surface panes, an optical phenomena is established by which the incident light is reflected differently by panes provided with the same surface motif and disposed or installed close to each other in the same plane or even within one and the same pane. In practice, depending on the assembly position, one part of the surface can reflect brilliantly and brightly whilst an immediately adjacent parallel part of surface has a matt appearance. Even through this effect is purely visual and aesthetic, it does not at all degrade the traversing of the light to the elements, detectors, etc., situated on the other side of the pane.

The cause of the variation of the impression of brightness according to the position on the pane is as follows.

Structures which are entirely regular in the ideal case have a characteristic reflection motif in which, for a given angle of incidence of light, the reflection takes place in specified directions and no reflection takes place in angular ranges which are adjacent to them. If, in a zone of the glass, because of the production tolerances mentioned above, the structures are formed on the surface of the glass in a (slightly) different manner, the characteristic direction of reflection of that zone of the glass is oriented in another direction (another angle). The consequence is that situations appear in which an observer is in the direction of reflection for one part of the glass but not in the direction of reflection of the other part of the glass. Thus, one zone of the glass has a bright appearance (reflecting) and the other as a dark appearance. In principle, this effect also takes place on glass with a smooth surface, but which is for example curved, which also has a bright reflection appearance only at certain places for given positions of the sun and of the observer.

However, it is possible to look for possibilities of giving these glasses a regular appearance of the light reflection in a particular mounting case.

The external appearance of these surfaces should not however be essentially different from the regular structures available at present, and in particular the panes should be able to be used beside one another.

U.S. Pat. No. 4,411,493 discloses a pane for building windows which must contribute to energy saving both in summer (air-conditioning) and in winter (heating). By a linear motif of parallel lines, there is obtained with this configuration a reflection or absorption behavior which strongly depends on the angle of incidence of the light.

Many cases are known of the use of surfaces that are chemically etched or treated by sandblasting in order to give them more or less irregular structures.

Fundamentally, there is known (see DE3805067A1 and DE4102984A1) the technique which consists in impressing random superficial structures on rolled surfaces using rolls on which random surface structures have been created. In all cases on continuously rolled substrates which are longer than one roll revolution, these structures are repeated periodically as a result of the regular rotation of the roll.

The invention as claimed solves the abovementioned problems.

SUMMARY

The invention proposes glazing solving the abovementioned problems as well as a method making it possible to impress, by embossing or rolling a surface of a transparent pane, a structure whose average light reflection intensity depends as little as possible on the angle of observation. A device will also have to be created which is particularly well suited for implementing the method.

Dispensing with the usual present-day method of embossing or rolling in which a very regular overall structure of identical motifs is obtained, according to the invention, the surface of the substrate to be treated is embossed by a plurality of motifs identical or at least similar to a common basic motif but with depths and/or base areas which vary.

Thus, on the variation due to the production of intrinsically identical structures on the embossed or rolled surface and which, in practice, can be avoided only with non-negligible working, there is superimposed a predictable variation of the individual motifs or of structural elements. In this way, a variation is obtained over wide angular ranges in the directions of diffusion of light during reflection. On the one hand, this has the effect of reducing the average absolute intensity of the reflection in each individual angle of reflection and, on the other hand, in this way marked (or pronounced) transitions between the reflecting directions and the non-reflecting directions are avoided.

Globally, according to one embodiment, a more or less straight orientation of the individual embossed or rolled motifs is dispensed with in favor of less regular orientations, for example in the form of arcs of circle or of undulation, but, unlike irregular random structures (obtained for example by sandblasting or etching), a basic motif which varies to a greater or lesser degree is retained.

Thus, the pane (in particular made of glass) according to the invention has on at least one of its main surfaces a surface structure which is constituted by the assembly of individual motifs in relief, in particular pyramids, cones or truncated cones, able to be created by embossing or rolling, the surface of the pane comprising a structure constituted by individual motifs based on one or more basic motifs, said individual motifs varying on the surface of the pane in their depth or their height or the perimeter of their base area or in the position of their peak with respect to their base (the term "or" used between the different types of variations allows combinations of variations and is synonymous with and/or). The motifs are therefore at least partially different from each other.

Thus, the motifs on the surface of the pane are similar in their shapes (for example, they are all four-sided pyramids) but the orientation of their surfaces is not the same from one motif to another. It is possible to consider that the variation in the orientation of a surface of a motif amounts to rotating this surface about an axis perpendicular to the overall plane of the pane or about an axis parallel with the overall plane of the pane, or a combination of these two rotations. If a motif surface is rotated about an axis perpendicular to the pane when moving from one motif to another, the result is that the base lines of these motifs when aligned form zigzag lines. If a motif surface is rotated about an axis parallel with the plate which moving from one motif to another, the result is to vary the height or the depth of the motifs. The shape of the individual motifs varies in surface with respect to the basic motif, but some basic motifs can of course be on the surface.

The retention, as accurately as possible, of a basic motif is particularly advantageous when, by a regular fashioning, an optimal light trapping (or capture) structure is approached as closely as possible. In this case "light trapping" means a surface structure which optimizes the penetration of light into the substrate or into an absorber installed beneath the substrate, for example a solar cell.

Fundamentally, the light trapping effect of a structured surface becomes better as the elements of the structure become more tightly compacted. Basic motifs which can be produced on the surface of a substrate as closely to each other as possible or directly joined to each other, and therefore for example pyramids or truncated pyramids which have a base area which is at least triangular (at least three sides) but preferably of the quadrilateral or hexagonal type and in particular a base area in which all of the sides are equal is preferred. As a variant, and depending on the requirements and the design objectives, it is possible however to use other basic motifs, for example cones or truncated cones, and to modify them in the way proposed by the invention. In this case, it will obviously not be possible to avoid small intermediate spaces.

Preferably, the individual motifs are directly adjacent to each other.

In the context of the invention, it is possible to produce on one and the same surface of pane different basic motifs situated beside one another or in different groups. Moreover, it is possible to deliberately provide definite separations between the basic motifs. They must however be dimensioned such that one entire basic motif cannot be inserted between two basic motifs. The distance between the centers of the basic motifs will therefore be less than double the dimensions of its sides.

All of these embodiments, both with regard to the surface of the substrate (in particular a pane) and the surface of the associated fashioning tool (by embossing or rolling), are midway between an arrangement that is as regular as possible and an entirely random irregular arrangement of motifs or of structures. In a way that is similar to the expression "fuzzy logic", it is also possible to refer to a deliberately fuzzy motif.

When, in the present description, the preferred manufacturing method is mentioned, namely by rolling only, other methods are not however excluded, for example embossing using dies or casting in molds. It is even possible to consider the use of surface structures according to the invention in the pressure injection method for panes made of synthetic materials by giving an appropriate surface structure to a wall of the cavity of the injection casting mold.

According to one embodiment, the variation according to the invention of the individual motifs relates to their depth/height and more precisely to their depth of penetration or their relief with respect to the ideally smooth surface of a substrate, and/or the shape or the perimeter of the base areas of the individual motifs.

Studies by the inventor have shown that a random variation of the depth or of the height of the individual motifs makes it possible to bring about, in defined conditions, a reduction of the reflection problems mentioned at the beginning. The variation of the height and/or of the depth provides a reflection curve which is flatter than that of the usual surface structures. Solely from a commercial point of view, this solution is particularly advantageous because it can be achieved with motifs of the same perimeter as those of the usual structures and it cannot therefore be distinguished from them with the naked eye.

However, this solution has certain limits. The depth of penetration of the individual motifs cannot be increased at will for technical reasons, because the available substrates are not of any thickness whatsoever (these thicknesses being between 3 and 6 mm) and furthermore, it is also necessary to take account of the problems of separation between the substrate and the structuring tool. Thus, for the lateral dimensions and the thickness of glass currently used, depths of penetration greater than about 0.9-1.0 mm are difficult to achieve.

Consequently, the variation of the depth can be obtained only by a reduction of an "optimal" depth. However, this results in a reduction of the angle of the sides of the structures and therefore a reduction of the light trapping effect by the structure and a reduction in efficiency, in particular in solar applications. A reduction of the light trapping effect could furthermore result in new problems of reflection reinforced at certain angles.

In fact it is necessary to note here that in particular for special solar applications, the intention is to optimize the light trapping effect that can be obtained finally by embossings (negative or indented motifs) in the surface of the substrate. However, in the context of the invention, its use on individual protruding motifs (which positively protrude above the basic surface) and their combination with negative motifs is in no way excluded.

In the case of a variation in the depth or in the height of the basic motifs, it is possible for the deepest or highest points of the individual motifs not to extend over a straight line; in particular they can follow an oscillating line.

In certain cases of application, it is recommended to provide a variation of the base area (or of the lateral dimensions) of the individual motifs which is possible alone or in combination with the depth variations mentioned above. In concrete terms and by way of example, it is possible to deform an initially square pyramid base into one with a diamond or parallelogram shaped perimeter, the direction of the deformation being able to follow the two diagonals. The same obviously follows to the base areas of pyramids whose base is not a quadrilateral (triangular, hexagonal or not square). With said controlled deformation, a modification of the angle of the lateral surfaces of these pyramids is obtained both with respect to the ideal surface (or the overall surface of the substrate) and with respect to the direction of rolling (in the case of the use of a rolling roll) or even with respect to any straight line which extends along the surface of the glazing pane.

In particular, the basic motifs can be pyramids in which the angles formed by the sides of the base areas are modified in steps.

In particular, in the case in which the base areas of the pyramids are quadrilaterals, it is possible to vary the basic motifs by variation of the angle included between the sides of the said base area, the said sides then being able to comprise two alignment lines (FL, FL') which globally extend perpendicular to each other and which are both constituted by non-parallel base sides attached to the pyramids and starting from which the perimeters of the base areas of the pyramids are constructed by parallel step-by-step displacement.

In particular, the alignment lines (FL, FL') can be globally symmetrical with respect to the global alignment line, which simply means that globally the same angles occur again between the lines FL and the global alignment line as between the lines FL' and the global alignment line.

Moreover, the alignment lines (FL, FL') can follow a periodic undulation in their longitudinal development (that is to say in their global alignment line).

Thus, in an alignment line, the base area sides of the motifs (pyramids in particular) can be on either side of the global orientation of the alignment line.

In particular, the alignment lines (FL, FL') can be constituted by the assembly of at least two groups of parts, the angular deviations with respect to the global direction of the alignment line for one of the two groups being oriented on one side of the global alignment line, and the angular deviations with respect to the global direction of the alignment line for the other group being formed towards the other side of the global alignment line.

The deformations are also possible in the lateral surfaces of the actual individual motifs, these lateral surfaces can also be curved. Furthermore, it is obviously also possible to modify non-polygonal (round or oval) individual motifs by the method according to the invention and to bring them together in order to obtain an overall structure which does not have reflection peaks.

In concrete terms, the angle of a lateral surface of a pyramid with respect to the ideal surface becomes more acute at a depth that is assumed identical when the base area of that pyramid is deformed into a diamond shape. If depth variations are superimposed, it is no longer possible to define dimensions and angles for each pyramid, and the global structure or the reflection direction or directions are very close to a random structure.

However, even on a random structure, the reflection peaks described at the beginning cannot be excluded absolutely, but the embossed surface structure according to the invention makes it possible to avoid them to a very great degree and in a reproducible manner.

The variation of the basic motif can be achieved by varying the position of the peak of the motifs with respect to their base. This is particularly advantageous if it is not desired to vary the height or depth of the motifs and if it is desired that the alignment lines are well aligned in straight lines (particularly in the case of four-sided pyramids whose base area is a right-angled quadrilateral. In fact, simply by modifying the position of the peak, the orientation of the sides of the pyramids is modified, but on the contrary, in appearance to an observer, the motifs appear, a priori, as all identical. Moreover, as the depth or the height is not altered, it is possible to choose the optimal pyramid height, that is to say the largest that the chosen manufacturing process will allow, and this applies to all of the motifs.

The variations can be provided at will in small steps or also in sudden jumps and can be regular or irregular. They can be repeated periodically, even at periods smaller than the circumference of a rolling roll. Thus, the surface of the rolling roller (or roller) can have periodic repetitions of "groups of motifs". It is therefore possible for there to be several "repetition periods" on the circumference of said roll.

The periodic variation deliberately applied to the angle of reflection must vary in its absolute amplitude to a greater degree than the undesirable variation (caused by production) that it serves to mask.

The same applies to the periodicity of the variation applied deliberately, which must have a length as short as possible in order to give an optical appearance that is as homogeneous and as regular as possible. In fact, when the repetition of the motif or the repetition of the groups of motifs extend over distances that are too long, it is possible to perceive it with the naked eye as undulations or similar, even at great distances.

In concrete terms, in an advantageous embodiment of the invention, it is possible to obtain an undulated development of the series of successive individual motifs which vary geometrically in steps, the length and amplitude of the undulations varying as a function of the step of said variations. If it is desired that the motifs should appear as identical and as aligned as possible, it is possible to act only on the variation of their depth. As shown in FIG. 6, this nevertheless produces a variation of the orientation of the surfaces of the motifs, but in appearance the sides of the base areas of the motifs are all however well aligned.

In the context of the invention, it is possible to combine a variation of depth of the motifs with at least one other type of variation, like that of the perimeter of their base area, or that of the position of their peak with respect to their base. Thus the term "or" used to give the types of variation possible (in particular in the claims) covers the combinations of variations and is therefore synonymous with and/or.

With the help of appropriate measuring and simulation methods, it is possible to demonstrate the effect of the surface structure according to the invention on the reflection behavior. At the same time, there remains a certain similarity with the regular motifs used beforehand, such that, fundamentally, panes produced by current-day methods and those by the new way of producing these panes can be combined freely.

Fundamentally, the structured surfaces according to the invention could also obtain additional roughness by chemical or sandblasting means. This type of roughness of the surfaces typically creates (at microscopic level) small surface structures which are essentially smaller that the structures according to the invention, which are of the order of magnitude of a few millimeters. However, tests have shown that in solar cells, the light trapping that the macroscopic structures according to then invention aims to improve is degraded.

Even though the applications (photovoltaic, increasing the light trapping effect) of these surface structures mentioned here prefer structuring on just one side and on just one face, and that a double-face structuring could even be harmful for the desired effect, the surface structure described here could obviously also, for a decorative purpose, be produced on both faces of a pane.

The invention also relates to the assembly comprising the pane according to the invention and an element capable of collecting the light energy traversing said pane, said element being placed facing said pane, said pane comprising the surface structure on the opposite face to said element. The pane can therefore also have a structure on both faces but this is not necessary. The surface structure is therefore imperatively at least on the side opposite to that of the light energy collector element. The element can in particular be a photovoltaic cell or a body (such as a black body) intended to be heated by the light energy, such as for example a ducting or reservoir containing water that is required to be heated. For the case in which the element is a photovoltaic cell, the pane and the element are generally juxtaposed, a resin having a refractive index greater than that of the material constituting the pane being placed if necessary between the pane and said photovoltaic cell.

A device according to the invention for the purpose of implementing the manufacturing method of these panes will comprise at least one tool (a roll or a flat embossing surface, for example the wall of a recess and of an injection mold) whose surface has a negative shape of the structure which must be impressed in the surface of the pane by contact with the tool.

In any case, the plastically non-deformable material of the pane is raised to high temperature in contact with the tool and, by plastic deformation, the structuring which is defined by the tool progressively increases in the contact surface. The tolerances mentioned above with respect to an ideal structure obviously cannot be avoided, but they can be reduced by harmonization of the detailed structures of the tool with the behavior of the particular material of the pane.

When glass panes are used, they will be chemically or thermally hardened according to requirements after having impressed the structure.

Other details and advantages of the subject of the invention will emerge from the drawing of an example embodiment and from its description given below.

In the illustrations, which are simplified and not to scale:

BRIEF DESCRIPTION OF THE DRAWINGS

FIGS. 3a to 3c show a comparison between the optical appearance of an existing motif and an embodiment according to the invention, FIG. 4 shows an enlarged view of a surface structure according to the invention with variation of the perimeters of the base area of the individual motifs or basic motifs and FIG. 5 shows a cross section through a part of a pane provided with the surface structure according to the invention in order to show the variation of the depth of the individual elements of this structure for constant lateral dimensions.

DETAILED DESCRIPTION

Figure 1:
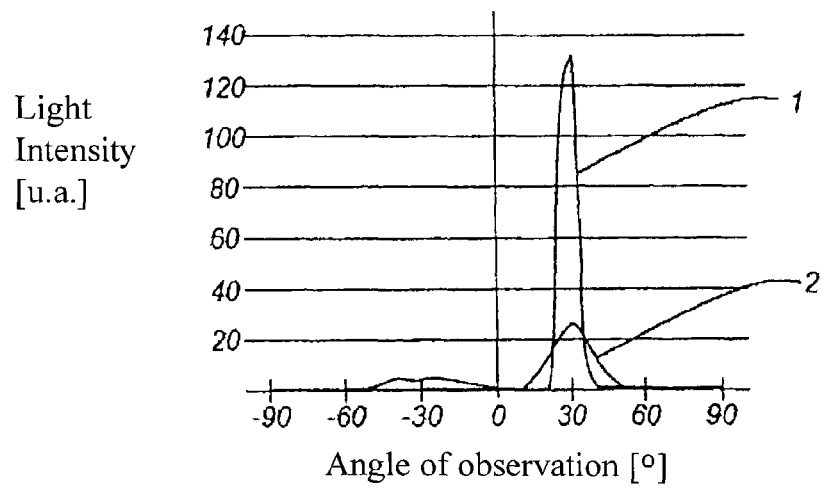
FIG. 1 shows a light intensity diagram of the reflection plotted with respect to a horizontal angle of observation for a constant vertical angle of observation, for a surface structure according to the prior art (aligned pyramids with square bases) and for a simulated surface structure according to the invention, in direct comparison.
Figure 2:
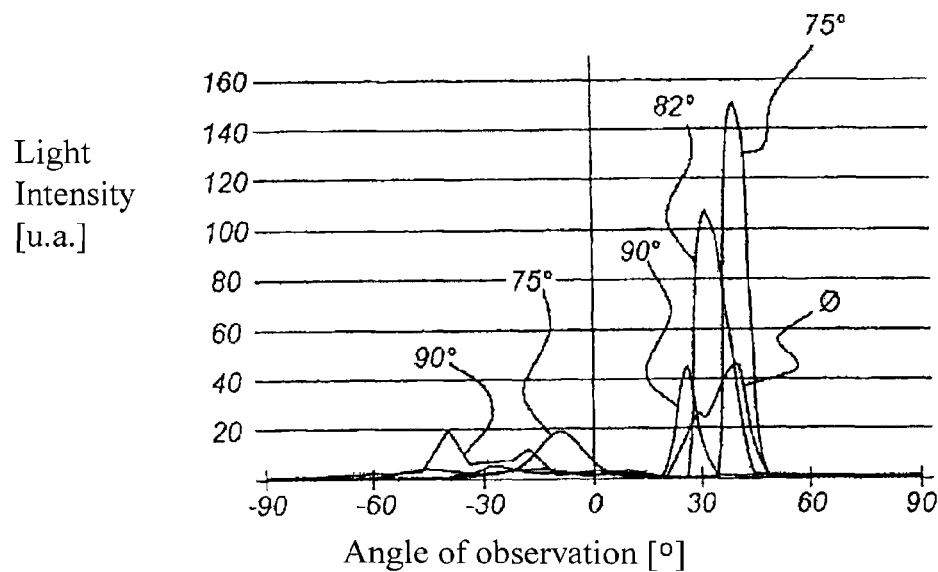
FIG. 2 shows another light intensity diagram of the reflection plotted to the horizontal angle of observation for a constant vertical angle of observation for a simulated surface structure according to the invention in which the quadrilateral pyramid base area of the embossing has been deformed into diamond shapes having different angles.

For the measurements and simulations which have provided the results shown in FIGS. 1 and 2, the following assumptions have been made:

the surface in question (structured) of the pane is situated at an angle of 35° to the horizontal, the solar light strikes this surface at an angle of 38° to the vertical, the observer looks at this surface at an angle of −10° to the horizontal and he turns around a fixed point of vision along a horizontal arc. This arc is shown on the "angle of observation" axis.

In this way there has been simulated the fitting of structured panes on the surface of an inclined roof which is exposed to a defined solar radiation, an observer passing on the flat ground in front of this roof (of a house) and observing the variations of intensity of the reflected light.

In FIG. 1 can be seen two curves of different simulation of the intensity of the reflected light at an angle of observation of between −90° and +90°. As stated above, the representation of reflection intensities at this angle of observation however relates to a constant height of the observer's eyes with respect to the imaginary surface of the roof (which carries the reflecting surface) and to a constant position of the sun during the displacement of the observer from −90° to +90°.

Curve 1 (the reference curve) shows in these conditions a sharp point (thinner, more pointed) at an angle of observation of 30°. This curve represents the reflection of a surface structure which is constituted by non-variable individual motifs. The point of this reflection curve forms the strong reflection angle of the surface structure which the observer's eye perceives at that specific angle of observation. Clearly, the intensity of the reflection reduces very greatly as soon as the angle of observation varies slightly. This explains the phenomenon explained at the beginning of very irregular reflection of plates situated beside one another or of adjacent zones in one and the same glass plate.

It can be seen that curve 2 has a much flatter shape. It has been determined by optical simulation of a surface structure according to the invention which is constituted by the assembly of individual motifs whose base areas have variable parameters. This will be described again in more detail below.

FIG. 2 shows clearly that in a narrow defined range of angle of observation, the intensity of reflection greatly depends on the shape of the base area of the pyramids (diamonds). This diagram contains several measurement curves of simulated surface structures which are all constituted by the assembly of identical pyramids (basic motifs), but the angle included between the sides of the parallelogram-shaped base areas is modified from one curve to another, and this is so from 75° to 90°, passing though 82°. The curves are all drawn with the associated included angle. All of the angles of opening are obviously measured in the same direction.

In the same simulation conditions as in the curves described here, for the included angle of 105°, it is observed that a fine (pointed) reflection peak is no longer obtained. The corresponding curve has not however been shown here.

At an included angle of 75°, it is possible to see a distinct point (absolute maximum) of intensity of the reflection at an observation angle of about 40°. Another relative maximum is situated at an observation angle of about −10°.

At an angle of opening of 82°, an absolute maximum is observed at an observation angle of about 35°, but beside that latter there is no longer any relative sharp maximum.

At an included angle of 90°, there is an absolute maximum at about 25° and a relative maximum at about −40°.

It can be seen that the points of the measured curves already shift according to the observation angle because of the modification of the angle. They distinctly flatten as the observation angle increases.

It is also recalled that in this representation, and similarly for FIG. 1, the assumption has been made that the angle of elevation/angle of incidence of the sun is constant, and that when the height of observation is modified, other reflection peaks are also obtained.

The average curve indicated by ø, which fictitiously gives the development of the intensity for a surface structure constituted by the assembly of different individual motifs, is much flatter than the reference curve (FIG. 1) which was determined on the existing product. On the one hand the result of this is that the reflection intensity is greatly reduced for the angle of observation of reflection but that the reflection depends much less strongly on the angle of observation. Small modifications of the observation angle, whether in the plane or in height, no longer give rise to modifications of the reflected image that are too abrupt.

FIGS. 3a, 3b and 3c show a comparison between parts of a flat glass produced and marketed by the applicant under the brand name "Albarino P" and having regular surface structures (FIG. 3a) and a part with a surface structure according to the invention (FIG. 3c). The structural characteristics or basic motifs, namely pyramids impressed in the surface of a glass pane, are represented here only by their perimeters. The length of a real pyramid side is about 2.5 mm for a comparative motif. In the known product, all of the pyramids are of the same size, to within the technical manufacturing capabilities, and have the same perimeter and the same depth. In order to improve visibility, the lateral sides of the pyramids which penetrate in depth have not been shown, only the edges or sides of the base area which are situated substantially in the overall surface of the pane have been shown.

In the following text, sides of pyramids or sides will not be mentioned, that is to say the lateral surfaces (triangular) of the pyramids, but simply lines of the sides which are shown in a simplified manner in FIGS. 3a to 3c and 4 of the base areas of these pyramids.

The difference between the "conventional" motif and the motif according to the invention can be detected on real panes only after a more in-depth examination. In comparison with a real motif in a straight regular line, the motif according to the invention is deformed only in an almost invisible manner. It can however be seen with the naked eye that the external edges and/or the alignment lines of the part shown in FIG. 3c oscillate slightly with respect to the structure according to the invention, whereas the known structure has lateral or alignment lines that are straight lines.

The expression "alignment lines" here refers in a simplified manner to the lines which are formed by the successive identical sides of pyramids disposed directly one behind the other in rows. In FIG. 3a, two arrows indicate these alignment lines.

By way of example of the production according to the invention of the deformation of the alignment lines and therefore of the base areas of the pyramids, it is possible to give the following rules.

In the present example, the fundamental orientation of all of the alignment lines forms, as in the known structure of FIG. 3a, an angle of 45° to the horizontal (of the figure). In other words, a link between the two end points of alignment lines has at least approximately this angle of 45°.

According to the invention, the longitudinal directions of the sides of the successive pyramids along each alignment line are modified in steps, but their lengths remain unchanged. In other words, according to the invention, a variation of the angle of the individual sides of the pyramids is superimposed on the general or global orientation of the alignment lines which results in the undulation of the alignment line in FIGS. 3b and 3c.

Globally, two successive pyramid sides do not have the same angular position or the same setting angle (Anstellwinkel in German) (that is to say the same orientation) but follow each other in a zigzag, but within each alignment line there are only obtuse angles.

In an advantageous embodiment of the invention, the orientations (setting angles) of two groups of pyramid sides are modified according to different rules. The individual lines of these two groups are then assembled in an alternating manner in order to obtain an alignment line. In this way a continuous zigzag line is obtained upon which an undulation is superimposed. Thus, if the pane is looked at straight on, it is possible to see, on the one hand, the zigzag when moving from one pyramid to another and, on the other hand, on a larger scale, a global undulation of the alignment lines.

In the example shown in FIG. 3c, the first group is constituted by eleven pyramid sides which, starting from a setting angle of 35°, are modified in steps of two degrees up to a setting angle of 45° and then return to a setting angle of 35°.

The second group is constituted by eleven other pyramid sides which, starting from a setting angle of 45°, are modified in steps of two degrees up to a setting angle of 55° and then return to an angle of 45°.

The two groups therefore have an angular range of 10° with respect to the basic dimension (direction) of 45°, each group containing differences only in one direction (and therefore a setting angle which is either ≥45° or ≤45°).

By combining these two groups the upper alignment line FL shown in FIG. 3b is obtained, which is constituted by 22 individual pyramid sides of the same length.

A second alignment line FL' which extends globally in a direction perpendicular to the first one (shown at the bottom in FIG. 3b) is created symmetrically to the alignment line FL on the horizontal axis. The expression "globally perpendicular" here means that the global links already mentioned between the end points of two alignment lines are perpendicular to each other.

In FIG. 3c, it is seen that in order to create the surface structure according to the invention with "regularly deformed" pyramid elements, the two alignment lines FL and FL' assembled by their corners at their ends in FIG. 3b are multiplied by parallel displacement along the side of a pyramid. Each time, an end of the displaced alignment line is placed exactly at the transition between two adjoining pyramid sides. In this way the resultant orientation of the parallel displacement is necessarily not always the same but depends on the angle of the pyramid side in question. Even though the displaced alignment line always retains the same length, the series of free ends of a series of parallel alignment lines exhibits the same profile of an alignment line which extends in a zigzag manner. This has been shown clearly in FIG. 3c by the two outer closing alignment lines. It can be seen clearly that the alignment lines have been produced with a periodic undulation which can be continued with no problems on larger surfaces.

It is obvious that these step by step variations of the base areas are also possible with basic motifs that are not quadrilateral. In the case of basic motifs with a triangular perimeter (triangular pyramids), a modification of the length of at least one side of the triangle could not however be avoided. Globally, because of the visual balance over the known panes, an embodiment with quadrilateral basic motifs is preferred.

FIG. 4 once again shows the overall appearance of a structured surface according to the invention obtained with the construction method shown in FIG. 3c. Three pyramid base areas of the motif have been shown in the form of enlarged diamonds. They represent extreme deformations and an intermediate case. In the overall pattern, these shapes are not directly adjacent and can be separated from each other by one or more individual motifs which exhibit intermediate stages of the deformation, such that globally progressive transitions are obtained and therefore undulating or zigzag lines that are not very extreme.

With a plurality of macro-elements directly adjacent to each other, whole and jagged (on their edges) shown in FIG. 4, it is possible to structure any "endless" surface without joins, as in the conventional variant shown in FIG. 3a.

Figure 5:
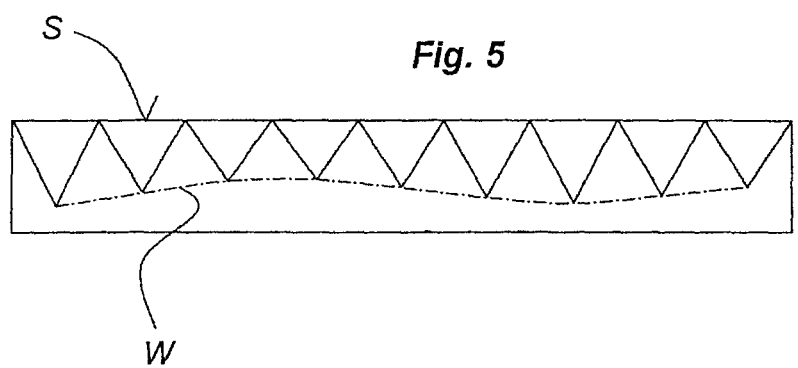
Figure 6:
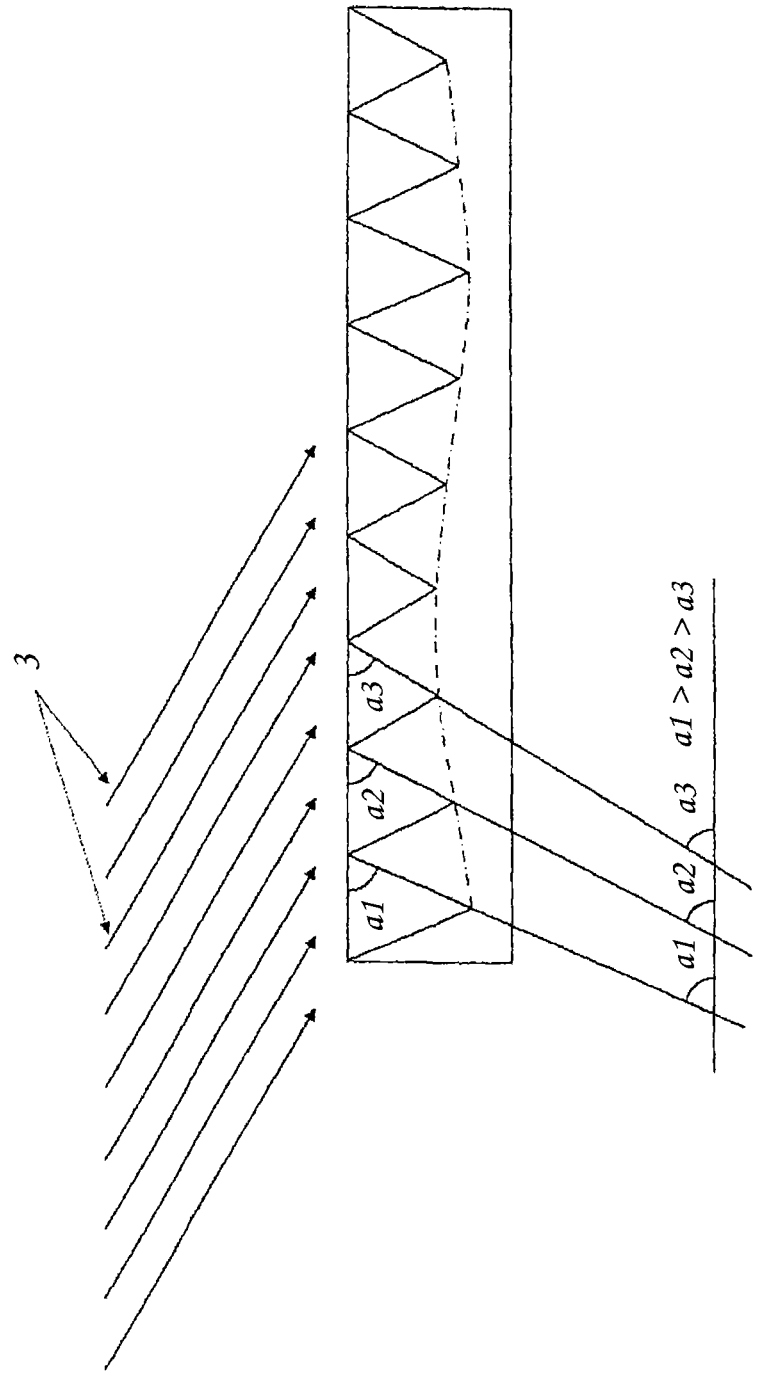
FIG. 6 shows the pane of FIG. 5 struck by parallel solar rays and shows the variation of the orientation of the pyramid sides when moving from one motif to another.

FIG. 5 again shows an example of a possible variation of the depth of pyramids formed by embossing. On a short part of a pane V embossed according to the invention, it can be seen that the depth of the pyramids disposed immediately beside one another is modified such that their deepest points can be connected to each other by an undulating line W. Thus is it clear that for a same base area of the pyramids, the orientation of their lateral surfaces with respect to the global surface S of the pane also varies. This is more particularly conveyed with the help of FIG. 6 which shows parallel solar rays 3 coming at an angle of incidence to the pane. The sides of the pyramids have been extended by straight lines in order to show clearly that these straight lines are not parallel and form different angles alpha1, alpha2 and alpha3 with the global plane of the plate. The solar rays therefore strike the surfaces of the pyramids at different angles and they are therefore also reflected differently from one pyramid to another.

The perimeters of the pyramids have been drawn here in an idealized manner, without deviations caused by production.

It is obvious that a pure depth variation could be produced in a relatively simple manner even with non-quadrilateral basic motifs as already mentioned.

Figure 7:
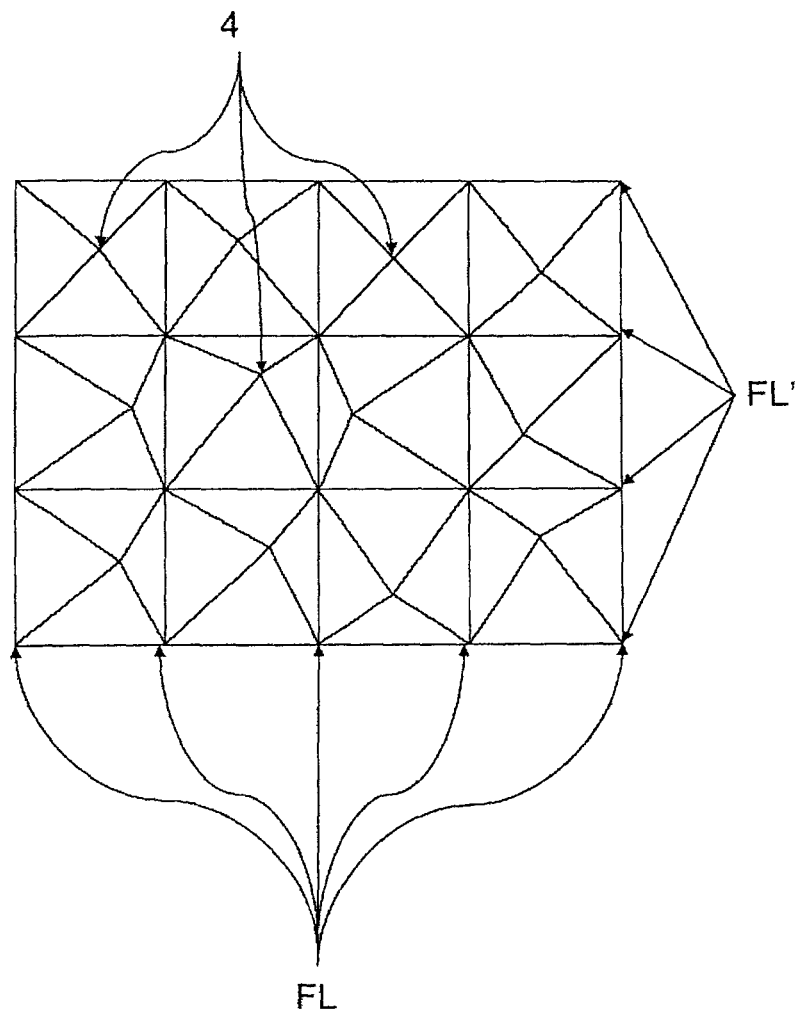
FIG. 7 shows juxtaposed motifs of a pane according to the invention, seen in a direction perpendicular to its surface, the motifs all having a square base, but the point of said motifs varying position with respect to the base areas of the pyramids.

FIG. 7 shows twelve juxtaposed motifs of a pane according to the invention, seen in a direction perpendicular to its surface. It can be seen that the basic motif is a pyramid with four sides, that is to say one whose base area is a quadrilateral. In this case, all of the individual motifs have the same base area and the same depth. Because of this, the base lines of the motifs are all aligned and the alignment lines are straight lines. In the case shown, the alignment lines form two groups of lines perpendicular to each other. What changes from one motif to another is, firstly, the position of the peak 4 of the pyramids with respect to their respective bases. This variation of position gives rise to the variation of the orientations of the surfaces of the sides of the pyramids when moving from one pyramid to another. Because of this, each pyramid reflects light slightly differently in comparison with its neighbor. This embodiment is very aesthetic because of the alignment of the base lines of the pyramids. For this type of motif, it can be said that the basic motif is a square-based pyramid whose peak varies in position with respect to the base.

The invention claimed is:

1. A transparent pane comprising:
   two opposing main surfaces; and
   a surface structure on at least one of the main surfaces of the pane, the surface structure including an assembly of individual motifs in relief that are based on one or more basic motifs,
   wherein the individual motifs are obtained by varying at least one structural characteristic of the one or more basic motifs on the at least one of the main surfaces of the pane, the at least one structural characteristic being a shape of a perimeter of a base area of the motif, and
   wherein the individual motifs are pyramids whose base areas are quadrilaterals and in which angles formed by sides of the base areas of the pyramids are modified in steps, such that the individual motifs vary by variation of the angles formed between the sides of the base areas.

2. The transparent pane as claimed in claim 1, wherein, the sides of each pyramid delimit two alignment lines that globally extend perpendicular to each other and that are both constituted by non parallel base sides of the pyramids and starting from which the perimeters of the base areas of the pyramids are constructed by parallel step-by-step displacement.

3. The transparent pane as claimed in claim 2, wherein the alignment lines are symmetrical.

4. The transparent pane as claimed in claim 2, wherein the alignment lines are formed with a periodic undulation of their longitudinal development.

5. The transparent pane as claimed in claim 2, wherein, in one of the alignment lines, the base area sides of the pyramids are on either side of a global orientation of the one of the alignment lines.

6. The transparent pane as claimed in claim 5, wherein each alignment line includes an assembly of at least two groups of parts, angular deviations with respect to a global direction of one of the alignment lines for one of the two groups being oriented on one side of the global direction of the one of the alignment lines, and angular deviations with respect to the global direction of the one of the alignment lines for the other group being formed towards the other side of the global direction of the one of the alignment lines.

7. The transparent pane as claimed in claim 1, wherein the pane is a glass pane hardened thermally or chemically.

8. The transparent pane as claimed in claim 1, wherein the individual motifs are directly adjacent to each other.

9. The transparent pane as claimed in claim 1, wherein in a case of a variation in the depth or the height of the individual motifs, deepest or highest points of the individual motifs do not extend over a straight line.

10. The transparent pane as claimed in claim 1, wherein the individual motifs are impressed in a form of recesses in a material constituting the pane.

11. The transparent pane as claimed in claim 1, wherein the individual motifs are created in a form of reliefs protruding with respect to the at least one of the main surfaces of the pane.

12. The transparent pane as claimed in claim 1, wherein two surfaces of the pane include a surface structure.

13. A method of manufacturing the transparent pane as claimed in claim 1 by embossing or by rolling.

14. An assembly comprising:
a transparent pane as claimed in claim 1; and
an element configured to collect light energy traversing the pane,
wherein the element faces the pane and the surface structure is placed on an opposite side from the element.

15. The assembly as claimed in claim 14, wherein the element is a photovoltaic cell.

16. The assembly as claimed in claim 15, wherein the pane and the photovoltaic cell are juxtaposed, a resin having a refractive index greater than a refractive index of a material constituting the pane being placed as needed between the pane and the photovoltaic cell.

* * * * *